United States Patent [19]

Larson et al.

[11] Patent Number: 4,479,097

[45] Date of Patent: Oct. 23, 1984

[54] LOW VOLTAGE, LOW POWER RC OSCILLATOR CIRCUIT

[75] Inventors: David N. Larson, Carrollton; Jeffrey Ireland, Farmers Branch; Michael B. Terry, Carrollton, all of Tex.

[73] Assignee: Mostek Corporation, Carollton, Tex.

[21] Appl. No.: 270,528

[22] PCT Filed: Dec. 24, 1980

[86] PCT No.: PCT/US80/01724
§ 371 Date: Dec. 24, 1980
§ 102(e) Date: Dec. 24, 1980

[87] PCT Pub. No.: WO82/02298
PCT Pub. Date: Jul. 8, 1982

[51] Int. Cl.³ .............................................. H03K 4/50
[52] U.S. Cl. .................................. 331/111; 331/108 D
[58] Field of Search ............... 331/111, 108 C, 108 D, 331/113 R, 143

[56] References Cited

U.S. PATENT DOCUMENTS

| | | | |
|---|---|---|---|
| 3,742,384 | 6/1973 | Breitzmann et al. | 331/111 |
| 3,904,988 | 9/1975 | Hsiao | 331/111 |
| 4,205,279 | 5/1980 | Beutler | 331/111 |
| 4,260,959 | 4/1981 | Allgood | 331/111 |
| 4,264,879 | 12/1978 | Duley | 331/111 |
| 4,365,212 | 12/1982 | Gentile et al. | 331/111 |

Primary Examiner—Edward P. Westin

[57] ABSTRACT

A resistor-capacitor oscillator circuit (10) is provided and includes a voltage comparator circuit (12). A capacitor (20) is connected to an input terminal (14) of the voltage comparator circuit (12). A resistor divider network (30) is coupled to an input terminal (16) of the voltage comparator circuit (12) for generating a reference voltage. A delay circuit (50, 52) is coupled to an output terminal (42) of the voltage comparator circuit (12). A discharge device (54) is coupled to the delay circuit (50, 52) and to the capacitor (20) for discharging the capacitor (20). A switching device (40) is coupled to the output (42) of the voltage comparator circuit (12) and to the resistor divider network (30) for controlling the application of the reference voltage to voltage comparator circuit (12).

5 Claims, 3 Drawing Figures

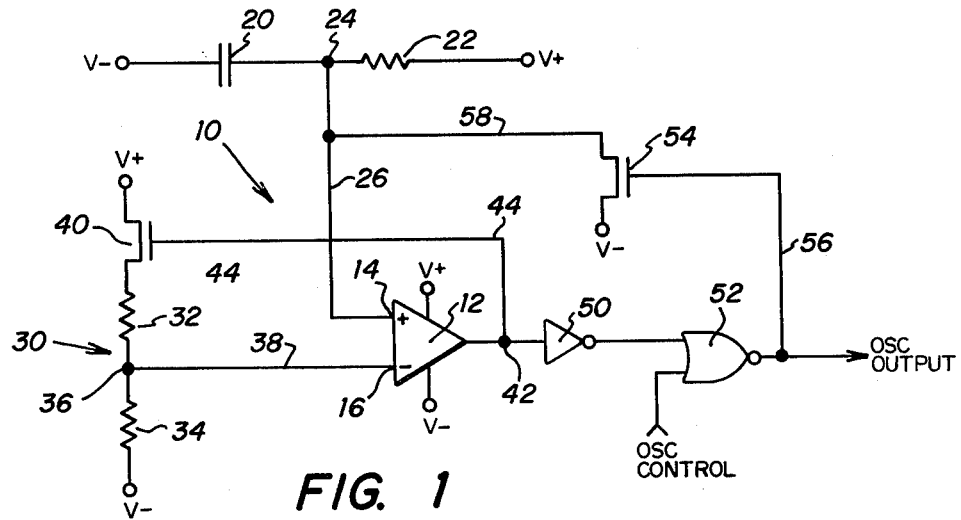
FIG. 1
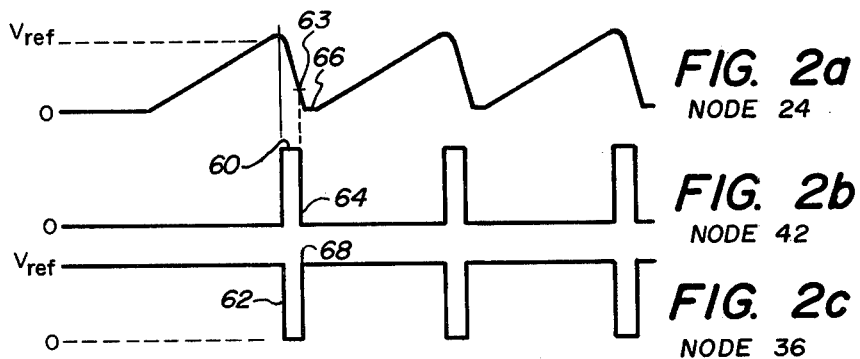
FIG. 2a NODE 24
FIG. 2b NODE 42
FIG. 2c NODE 36
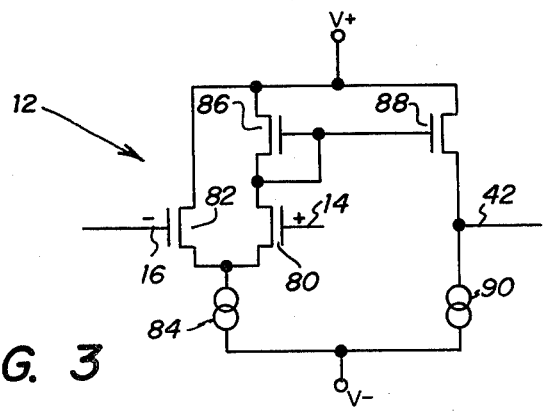
FIG. 3

LOW VOLTAGE, LOW POWER RC OSCILLATOR CIRCUIT

TECHNICAL FIELD

This invention relates to oscillators, and more particularly relates to an RC oscillator circuit operable at low voltage and low power requirements.

BACKGROUND ART

In the design of digital logic circuits, large scale integration techniques have brought about the construction of large numbers of components being fabricated on a single chip of silicon. In such circuitry, utilizing metal-oxide-semiconductor (MOS) techniques, random access memory devices as well as other semiconductor circuitry utilize numerous clock signals to provide a time base for such circuitry. Such clock signals are generated by oscillator circuits. Oscillator circuits find use in telecommunications integrated circuits, such as, for example, repertory dialers in which operation at low power and low voltage is essential.

A previously developed oscillator is shown in U.S. Pat. No. 4,205,279 issued to Beutler on May 27, 1980 and entitled "CMOS Low Current RC Oscillator". Such previously developed oscillators have not provided operating characteristics at sufficient low voltage and low power requirements. Additionally, such previously developed oscillators are sensitive to temperature and not completely independent of environmental temperatures.

A need has thus arisen for an RC oscillator for use in semiconductor circuitry which operates at low voltage and low power requirements. Further, a need has arisen for an RC oscillator that is less sensitive to temperature and supply voltage parameters. Additionally, a need has arisen for an RC oscillator that can be fabricated on a single CMOS semiconductor chip with improved reliability while being cost effective.

DISCLOSURE OF THE INVENTION

In accordance with the present invention, an RC oscillator is provided for fabrication on a CMOS semiconductor substrate which offers the advantages of low voltage and low power operating requirements and improved sensitivity to temperature and supply voltage parameters.

In accordance with the present invention, an RC oscillator circuit is provided which includes a voltage comparator circuit having first and second input terminals and an output terminal. The voltage comparator circuit generates an output signal at the output terminal. The RC oscillator circuit further includes a capacitor coupled to the first input terminal of the voltage comparator circuit. A voltage generator is coupled to the second input terminal of the voltage comparator circuit for generating a reference voltage for application to the voltage comparator circuit. A delay circuit is coupled to the output terminal of the voltage comparator circuit for delaying the output signal. A discharge device is coupled to the delay circuit and to the capacitor for discharging the capacitor, the discharge device being responsive to the output signal generated by the voltage comparator circuit. The RC oscillator circuit further includes a switch device coupled to the output terminal of the voltage comparator circuit and to the voltage generator. The switch device is responsive to the output signal of the voltage comparator circuit for controlling operation of the voltage generator, such that upon actuation of the switch device, the reference voltage is removed from the second input terminal of the voltage comparator circuit.

BRIEF DESCRIPTION OF THE DRAWINGS

For a more complete understanding of the present invention and for further advantages thereof, reference will now be made to the following Detailed Description taken in conjunction with the accompanying Drawings in which:

FIG. 1 is a schematic circuit diagram of the RC oscillator circuit of the present invention;

FIG. 2 illustrates signal waveforms illustrating the operation of the present RC oscillator circuit; and FIG. 3 is a schematic circuit diagram illustrating circuitry corresponding to the voltage comparator circuit illustrated in FIG. 1.

DETAILED DESCRIPTION

Referring to FIG. 1, the resistor-capacitor (RC) oscillator circuit of the present invention is illustrated and is generally identified by the numeral 10. RC oscillator circuit 10 includes a voltage comparator circuit 12 having a non-inverting input terminal 14 and an inverting input terminal 16. Voltage comparator circuit 12 may comprise, for example, a differential amplifier circuit to be further described with respect to FIG. 3. Voltage comparator circuit 12 operates in an active mode and an inactive mode. In the active mode, the output voltage of voltage comparator circuit 12 is dependent on the input voltages applied to input terminals 14 and 16. In the inactive mode, the output voltage of voltage comparator circuit 12 defaults to a known state independent of the input voltages applied to input terminals 14 and 16. In the present RC oscillator circuit 10, this known state is chosen as a logic low.

The period of oscillation of RC oscillator circuit 10 is governed by the component values selected for a capacitor 20 and resistor 22. Capacitor 20 and resistor 22 are interconnected to form a node 24 which is interconnected to input terminal 14 of voltage comparator circuit 12 via a signal line 26. Capacitor 20 is interconnected to a negative voltage supply source. Resistor 22 is interconnected to a positive voltage supply source. Capacitor 20 and resistor 22 are fabricated external to RC oscillator circuit 10 which is fabricated on a single MOS substrate. Only one resistor is utilized in the present resistor-capacitor oscillator circuit 10 to establish the period of oscillation, unlike previously developed RC oscillator circuits which have required two resistors.

A reference voltage applied to voltage comparator circuit 12 is generated by a resistor divider network, generally identified by the numeral 30, comprising a resistor 32 and a resistor 34. Resistors 32 and 34 are interconnected to form a node 36. The reference voltage is applied from node 36 via a signal line 38 to input terminal 16 of voltage comparator circuit 12. The application of the reference voltage to input terminal 16 of voltage comparator circuit 12 is controlled by a transistor which may comprise, for example, a P-channel MOS device. Transistor 40 is interconnected to the positive voltage supply source and resistor 32 of resistor divider network 30. The gate terminal of transistor 40 is interconnected to the output of voltage comparator circuit 12 at a node 42 via a signal line 44. Transistor 40 is turned on by the output of voltage comparator circuit 12, operating in the inactive mode, such that the reference voltage is reset and applied to input terminal 16 of voltage comparator circuit 12 prior to capacitor 20 beginning to charge at the start of each cycle as will be further described.

The output of voltage comparator circuit 12 is applied to an inverter 50 whose output is applied to a NOR logic circuit 52. NOR logic circuit 52 receives an oscillator control input signal. The output of NOR logic circuit 52 generates the oscillator output signal of RC oscillator circuit 10. The output of NOR logic circuit 52 is also applied to a transistor 54 via a signal line 56. Transistor 54 may comprise, for example, an N-channel MOS device. Transistor 54 is interconnected to the negative voltage supply source and is connected to node 24 via signal line 58. Inverter 50 and NOR logic circuit 52 function as a delay circuit for delaying the application of the output of voltage comparator circuit 12 to transistor 54. Transistor 54 is activated by the output of NOR logic circuit 52 and functions to discharge node 24.

Referring simultaneously to FIGS. 1 and 2, the operation of the present RC oscillator circuit 10 will be described. FIG. 2 illustrates the voltage waveforms present at node 24 (FIG. 2a), node 42 (FIG. 2b) and node 36 (FIG. 2c). Assuming that RC oscillator circuit 10 is at an initial condition, capacitor 20 being uncharged, node 24 will be at zero volts, node 42 will be low and node 36 will have a voltage equal to the reference voltage. Through operation of resistor 22, capacitor 20 will begin to charge node 24 towards the value of the reference voltage. When node 24 is charged to slightly above the reference voltage value, the inputs to voltage comparator circuit 12 will be such that voltage comparator circuit 12 operating in the active mode will generate an output at node 42 indicated by reference numeral 60 (FIG. 2a). This output will deactivate transistor 40 to remove the reference voltage from input terminal 16 of voltage comparator circuit 12, such that the voltage at node 36 will decrease to zero, reference numeral 62 (FIG. 2c).

The output of voltage comparator circuit 12 in the active mode will have caused NOR logic circuit 52 to generate its output, such that transistor 54 will have been activated to thereby discharge node 24. Node 24 will then discharge to approximately one N-channel threshold above V−, reference numeral 63, to thereby cause voltage comparator circuit 12 to operate in the inactive mode at which time the output of voltage comparator circuit 12 will drop to a low indicated by reference numeral 64 (FIG. 2b). This low output is applied to transistor 40, previously turned off by the output of voltage comparator circuit 12 in the active mode, to thereby actuate transistor 40 to cause the reapplication of the reference voltage to voltage comparator circuit 12, reference numeral 68 (FIG. 2c) to initiate a new cycle.

The delay between the time at which node 42 goes to a logic low and the time the output of NOR logic circuit 52 goes low will provide a sufficient time interval for transistor 54 to discharge node 24 completely to zero indicated by reference numeral 66 (FIG. 2a). The complete discharge of capacitor 20 ensures that the time constant of the RC oscillator circuit 10 will remain consistent to render RC oscillator circuit 10 less sensitive to changes in the supply voltage.

Prior to the complete discharge of node 24, transistor 40 will have been activated by the low output of voltage comparator circuit 12, operating in the inactive mode, such that node 36 will again rise to the voltage reference level indicated by reference numeral 68 (FIG. 2c). Since the output of voltage comparator circuit 12 is now low, the output of NOR logic circuit 52 will be low, such that transistor 54 will be deactivated to permit node 24 to charge. The cycle will now repeat, such that node 24 will be allowed to charge to slightly above the value of the reference voltage to again enable voltage comparator circuit 12 to provide an output at node 42.

In a typical embodiment of the present RC oscillator circuit 10, in which an 8 kHz clock signal is provided at the oscillator output, the value of capacitor 20 and resistor 22 are selected such that the time period in which node 24 charges to the reference voltage level is approximately 125 microseconds. The pulse width of the output of voltage comparator circuit 12 will be approximately, for example, 1 to 5 microseconds to render the present RC oscillator circuit 10 less sensitive to temperature, supply voltage variations and process parameters.

It therefore can be seen that the present RC oscillator circuit operates at low voltage and low power requirements. The accuracy of the period of oscillation is governed primarily by the values of capacitor 20 and resistor 22 which selection will also determine the degree to which RC oscillator circuit 10 is rendered temperature dependent.

FIG. 3 illustrates circuitry corresponding to voltage comparator circuit 12 (FIG. 1). Input terminal 14 of voltage comparator circuit 12 comprises the gate electrode of a transistor 80. Input terminal 16 of voltage comparator circuit 12 comprises the gate terminal of a transistor 82. The source terminals of transistors 80 and 82 are interconnected to a current source 84. The drain terminals of transistors 80 and 82 are interconnected to a transistor 86 which functions as a gain device. The gate terminal of transistor 86 is interconnected to the gate terminal of a transistor 88 which functions as a second gain device.

The source terminal of transistor 88 is interconnected to a current source 90 which functions as a load for transistor 88. The output of voltage comparator circuit 12, node 42, is formed between transistor 88 and current source 90. Transistors 86 and 88 receive the positive voltage supply source. Current sources 84 and 90 receive the negative voltage supply source. Transistors 80 and 82 may comprise, for example, N-channel MOS devices. Transistors 86 and 88 may comprise, for example, P-channel MOS devices. It therefore can be seen that voltage comparator circuit 12 may comprise the differential comparator illustrated in FIG. 3.

It therefore can be seen that the present RC oscillator circuit 10 utilizing MOS fabrication techniques and metal-oxide-semiconductor field-effect transistors provides for reduced power consumption and a circuit that operates at low voltage. Furthermore, the present RC oscillator circuit 10 operates substantially independent of temperature conditions. The accuracy of the period of oscillation is substantially controlled by the accuracy of the values of the capacitor and resistor external to the oscillator circuit which renders the present circuit process insensitive.

Whereas the present invention has been described with respect to specific embodiments thereof, it will be understood that various changes and modifications will be suggested to one skilled in the art and it is intended to encompass such changes and modifications as fall within the scope of the appended claims.

We claim:

1. An oscillator circuit having first and second voltage supply sources comprising:

differential amplifier means having first and second input terminals and an output terminal, said differential amplifier means generating an output signal at said output terminal and operating in active and inactive modes;

capacitor means coupled to said first input terminal of said differential amplifier means and to the first voltage supply source, said capacitor means being charged during said differential amplifier means inactive mode;

first switch means interconnected to said output terminal of said differential amplifier means and to the first voltage supply source;

first and second resistor means, said first resistor means being connected between said first switch means and said second input terminal of said differential amplifer means, said second resistor means being connected between said second input terminal of said differential amplifier means and the second voltage supply source, such that said first and second resistor means generate a reference voltage for application to said second input terminal of said differential amplifier means during a portion of said differential amplifier means inactive mode;

delay means connected to said output terminal of said differential amplifier means for delaying said output signal;

second switch means coupled to said delay means and to said capacitor means for discharging said capacitor means to thereby cause said differential amplifier means to operate in said inactive mode, said discharge means activated by said output signal generated by said differential amplifier means during said differential amplifier means active mode;

said first switch means activated by said output signal generated by said differential amplifier means during said differential amplifier means inactive mode for controlling generation of said reference voltage, such that said reference voltage is generated after said capacitor means has completely discharged;

said delay means comprising inverter means coupled to said output terminal of said differential amplifier means, and NOR logic means having one terminal thereof coupled to said inverter means and a second input thereof coupled to a control signal.

2. The oscillator circuit of claim 1 wherein said differential amplifier means includes:

first, second, third and fourth transistor means each having first and second terminals and a control terminal;

first and second current sources;

said first terminal of said first transistor means being connected to said first terminal of said second transistor means and to said first terminal of said third transistor means, said second terminal of said first transistor means being connected to said second terminal of said fourth transistor means and to said first current source, said control terminal of said first transistor means comprising said second input terminal of said differential amplifier means;

said second terminal of said second transistor means being connected to said first terminal of said fourth transistor means, to said control terminal of said second transistor means and to said control terminal of said third transistor means;

said second terminal of said third transistor means being connected to said second current source and comprising said output terminal of said differential amplifier means; and said control terminal of said fourth transistor means comprising said first input terminal of said differential amplifier means.

3. The oscillator circuit of claim 1 wherein said second switch means comprises transistor means having first and second terminals and a control terminal, said control terminal being connected to said delay means, said first terminal being connected to said capacitor means and said second terminal being connected to the second voltage supply source.

4. The oscillator circuit of claim 1 wherein said first switch means comprises transistor means having first and second terminals and a control terminal, said control terminal being connected to said output terminal of said differential amplifier means, said first terminal being connected to the first voltage supply source and said second terminal being connected to said first resistor means.

5. The oscillator circuit of claim 1 and further including:

third resistor means connected to said capacitor means and to the first voltage supply source.

* * * * *